United States Patent
Hsieh et al.

(10) Patent No.: US 10,319,924 B2
(45) Date of Patent: Jun. 11, 2019

(54) METHOD FOR MANUFACTURING FLEXIBLE SUBSTRATE, FLEXIBLE SUBSTRATE AND DISPLAY DEVICE

(71) Applicant: BOE TECHNOLOGY GROUP CO., LTD., Beijing (CN)

(72) Inventors: Ming-Che Hsieh, Beijing (CN); Lu Liu, Beijing (CN); Chunyan Xie, Beijing (CN); Hejin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 15/503,994

(22) PCT Filed: Jun. 6, 2016

(86) PCT No.: PCT/CN2016/084935
§ 371 (c)(1),
(2) Date: Feb. 14, 2017

(87) PCT Pub. No.: WO2017/124682
PCT Pub. Date: Jul. 27, 2017

(65) Prior Publication Data
US 2018/0108850 A1    Apr. 19, 2018

(30) Foreign Application Priority Data

Jan. 20, 2016  (CN) .......................... 2016 1 0038781

(51) Int. Cl.
*H01L 51/00* (2006.01)
*H01L 21/68* (2006.01)
(Continued)

(52) U.S. Cl.
CPC .......... *H01L 51/0097* (2013.01); *B32B 27/00* (2013.01); *H01L 21/6835* (2013.01);
(Continued)

(58) Field of Classification Search
CPC ......... H01L 51/00; H01L 21/68; H01L 27/32; H01L 51/52; H01L 51/56
(Continued)

(56) References Cited

U.S. PATENT DOCUMENTS 9,923,157 B2 *  3/2018  Yoon .................... H01L 51/0097
9,960,374 B1 *  5/2018  Fang .................... B32B 43/006
(Continued)

FOREIGN PATENT DOCUMENTS

| CN | 1392615 A | 1/2003 |
| CN | 103515313 A | 1/2014 |
| CN | 105552225 A | 5/2016 |

OTHER PUBLICATIONS

International Search Report and Written Opinion (including English translation of Box V) dated Oct. 21, 2016, for corresponding PCT Application No. PCT/CN2016/084935.
(Continued)

*Primary Examiner* — Sheikh Maruf
(74) *Attorney, Agent, or Firm* — Kinney & Lange, P.A.

(57) ABSTRACT

A method for manufacturing a flexible substrate, a flexible substrate manufactured using the method and a display device including the flexible substrate are disclosed. The method includes steps of: coating a glass carrier with a plurality of film layers, wherein each of at least one pair of adjacent film layers of the plurality of film layers is formed through steps of: S1: coating the glass carrier with a first film layer; and S2: coating the glass carrier with a second film layer over the first film layer so that the second film layer covers the first film layer, wherein the second film layer has an area greater than an area of the first film layer; and peeling off the plurality of formed film layers from the glass carrier to form a flexible substrate.

15 Claims, 2 Drawing Sheets

(51) Int. Cl.
   *H01L 51/56* (2006.01)
   *H01L 21/683* (2006.01)
   *H01L 27/32* (2006.01)
   *H01L 51/52* (2006.01)
   *B32B 27/00* (2006.01)

(52) U.S. Cl.
   CPC .......... *H01L 27/326* (2013.01); *H01L 51/003* (2013.01); *H01L 51/5256* (2013.01); *H01L 51/56* (2013.01); *H01L 2251/5338* (2013.01)

(58) Field of Classification Search
   USPC ........................................ 257/40; 438/82, 99
   See application file for complete search history.

(56) References Cited

U.S. PATENT DOCUMENTS

| | | | | |
|---|---|---|---|---|
| 2004/0192070 | A1* | 9/2004 | Tateishi | H01L 51/0013 438/780 |
| 2005/0139839 | A1* | 6/2005 | Park | H01L 27/322 257/79 |
| 2007/0241665 | A1* | 10/2007 | Sakanoue | H01L 51/5088 313/503 |
| 2008/0158498 | A1* | 7/2008 | Chang | G02F 1/133305 349/158 |
| 2009/0227074 | A1* | 9/2009 | Hong | G02F 1/133305 438/149 |
| 2010/0210055 | A1* | 8/2010 | Yoon | H01L 27/1266 438/30 |
| 2011/0260180 | A1* | 10/2011 | Kuranaga | G02F 1/133351 257/88 |
| 2012/0235315 | A1* | 9/2012 | Wu | H01L 21/6835 264/104 |
| 2013/0020731 | A1* | 1/2013 | Kim | G02F 1/133305 264/1.37 |
| 2013/0071650 | A1* | 3/2013 | Liu | B32B 37/26 428/333 |
| 2014/0041800 | A1* | 2/2014 | Okuyama | B29C 65/1432 156/247 |
| 2014/0042406 | A1* | 2/2014 | Degner | H01L 27/326 257/40 |
| 2014/0065389 | A1* | 3/2014 | Loy | H01L 21/2007 428/214 |
| 2014/0234664 | A1* | 8/2014 | Yasumoto | H01L 21/6836 428/698 |
| 2014/0306210 | A1* | 10/2014 | Lee | H01L 51/5203 257/40 |
| 2014/0323006 | A1* | 10/2014 | Song | H01L 51/003 445/24 |
| 2015/0075706 | A1* | 3/2015 | Cheng | H01L 21/6835 156/247 |
| 2015/0137098 | A1* | 5/2015 | Tanaka | H01L 27/3276 257/40 |
| 2015/0138494 | A1* | 5/2015 | Kim | G02F 1/133305 349/138 |
| 2015/0183932 | A1* | 7/2015 | Katayama | C08J 5/18 257/40 |
| 2015/0325631 | A1* | 11/2015 | Yamazaki | H01L 29/786 257/40 |
| 2015/0337203 | A1* | 11/2015 | Hida | C09K 19/2007 252/299.1 |
| 2016/0035978 | A1* | 2/2016 | Lin | H01L 51/0017 257/88 |
| 2016/0187686 | A1* | 6/2016 | Lou | G02F 1/1339 349/61 |
| 2017/0047534 | A1* | 2/2017 | Yoon | H01L 51/0097 |
| 2017/0096530 | A1* | 4/2017 | Yun | C03C 17/30 |
| 2017/0152419 | A1* | 6/2017 | Rantala | C08K 5/0025 |
| 2017/0293194 | A1* | 10/2017 | Hou | G06F 1/1637 |

OTHER PUBLICATIONS

First Chinese Office Action, for Chinese Patent Application No. 201610038781.2, dated Sep. 19, 2017, 8 pages.

\* cited by examiner

METHOD FOR MANUFACTURING FLEXIBLE SUBSTRATE, FLEXIBLE SUBSTRATE AND DISPLAY DEVICE

CROSS-REFERENCE TO RELATED APPLICATION

This application is a Section 371 National Stage Application of International Application No. PCT/CN2016/084935, filed on Jun. 6, 2016, entitled "METHOD FOR MANUFACTURING FLEXIBLE SUBSTRATE, FLEXIBLE SUBSTRATE AND DISPLAY DEVICE", which claims priority to Chinese Application No. 201610038781.2, filed on Jan. 20, 2016, incorporated herein by reference in their entirety.

BACKGROUND

Technical Field

Embodiments of the present disclosure relate to a field of flexible substrate, and more particularly, to a method for manufacturing a flexible substrate, a flexible substrate manufactured by the method, and a display device comprising the flexible substrate.

Description of the Related Art

Compared with a conventional rigid substrate, a flexible substrate is more and more widely used in some fields, such as a thin film printed circuit board, a flexible display panel, and the like, due to its light weight, thin thickness, and softness. In a flexible substrate manufacturing technique, a plurality of film layers are usually formed by coating a glass carrier with material such as polyimide or polyether-etherketone for several times, and the plurality of formed film layers are peeled off to form a final flexible substrate. However, during coating the carrier with the film layers, a raised region, where a thickness of the film layer is unstable, is formed at a periphery of the coated film layer, due to surface tension of the material, or a combined effect of surface tension and liquid flow. Further, this raised region becomes larger with the increase of the thickness of the film layer, and becomes higher with the increase of the number of the film layers.

SUMMARY

In order to at least partially overcome or alleviate the above-mentioned deficiencies, embodiments of the present disclosure provide a novel method for manufacturing a flexible substrate. In particular, according to an aspect of the present disclosure, there is provided a method for manufacturing a flexible substrate, comprising steps of: coating a glass carrier with a plurality of film layers, wherein each of at least one pair of adjacent film layers of the plurality of film layers is formed through steps of: S1: coating the glass carrier with a first film layer; and S2: coating the glass carrier with a second film layer over the first film layer so that the second film layer covers the first film layer, wherein the second film layer has an area greater than an area of the first film layer; and peeling off the plurality of formed film layers from the glass carrier to form a flexible substrate.

In the method for manufacturing the flexible substrate according to the embodiments of the present disclosure, although a portion having an unstable thickness is formed at an edge of the first film layer during the first coating, the glass carrier is coated with the second film layer over the first film layer so that the second film layer covers the first film layer. in other words, an area of the second film layer is greater than an area of the first film layer, so that the portion having the unstable thickness may be covered by the subsequently coated second film layer. As a result, a portion having an unstable thickness is only formed at an edge of the second film layer, and a planarization may thus be realized. In this way, the applicable process area is increased, and it eliminates the problems that the available coating area is small and the region having an unstable thickness of the film is large, due to double-layer coating.

Optionally, in step S2, an edge of the first film layer is spaced apart from an edge of the second film layer by a distance of 5 mm or more.

Optionally, the method further comprises a step of: providing a blocking layer on the first film layer for blocking water and/or oxygen before the step S2, wherein the second film layer covers the blocking layer in the step S2.

In an embodiment, the glass carrier is coated with the first film layer and the second film layer by means of a slit extrusion coating.

In an embodiment, the at least one pair of adjacent film layers comprises one pair of adjacent film layers, and the first film layer is coated on the glass carrier.

In an embodiment, the method further comprises a step of: providing a blocking layer between the pair of adjacent film layers for blocking water and/or oxygen.

In an embodiment, both the first film layer and the second film layer are polyimide film layers.

According to another aspect of the present disclosure, there is provided a flexible substrate manufactured by the above-described method. Optionally, a thickness of the second film layer is greater than or equal to 10% of a thickness of the first film layer.

According to a further aspect of the present disclosure, there is provided a display device, comprising the above-described flexible substrate.

BRIEF DESCRIPTION OF THE DRAWINGS

The above and other objects, features and advantages of the present disclosure will be more apparent from the following description of the optional embodiments of the present disclosure, in conjunction with the accompanying drawings, in which.

In all the drawings of the present disclosure, the same or similar structures are indicated by the same or similar reference numerals. In addition, the drawings of the present disclosure are only illustrative and are not drawn to scale.

DETAILED DESCRIPTION OF PREFERRED EMBODIMENTS

Optional embodiments of the present disclosure will now be described in detail with reference to the accompanying drawings. In the description, details and functions which are not necessary for the present disclosure are omitted, so as to prevent misunderstanding of the present disclosure. In addition, it should be noted that the "first" and "second" used in the present disclosure are merely for the purpose of facilitating distinction in the description, without any limiting effects.

Figure 1:
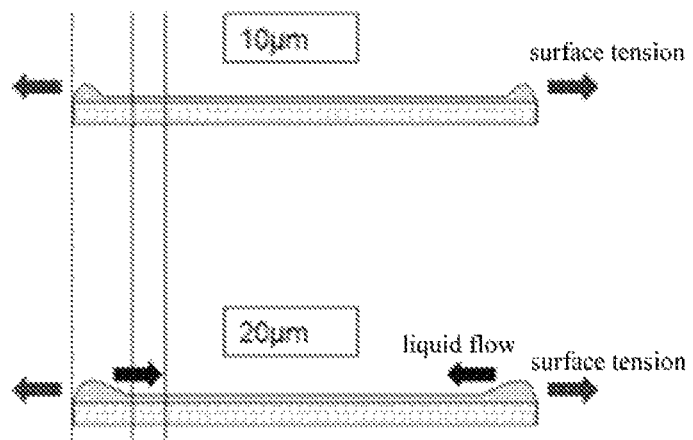
FIG. 1 schematically shows a principle diagram that a raised region, where a thickness of film layers is unstable, around the film-coated area becomes larger as the thickness of the film layers increases, when the film layers are coated.

FIG. 1 schematically shows a principle diagram that a raised region, where a thickness of film layers is unstable, around the film-coated area becomes larger as the thickness of the film layers increases, when the film layers are coated. During coating the carrier with the film layers, a raised region, where a thickness of the film layer is unstable, is formed at a periphery of the coated film layer, due to surface tension of the material, or a combined effect of surface tension and liquid flow. Further, this raised region becomes larger with the increase of the thickness of the film layer, and becomes higher with the increase of the number of the film layers.

Figure 2A:
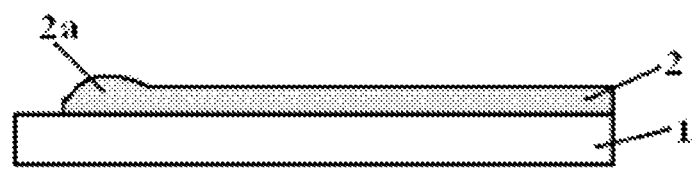
FIGS. 2A-2C schematically show various steps of an example of a method for manufacturing a flexible substrate according to an embodiment of the present disclosure.
Figure 2B:
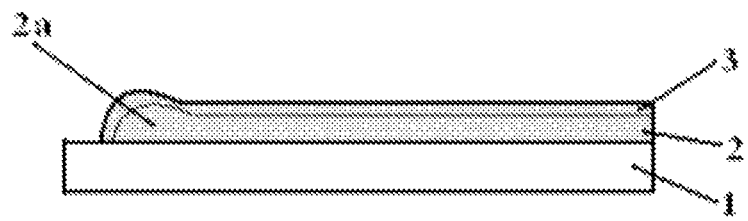
Figure 2C:
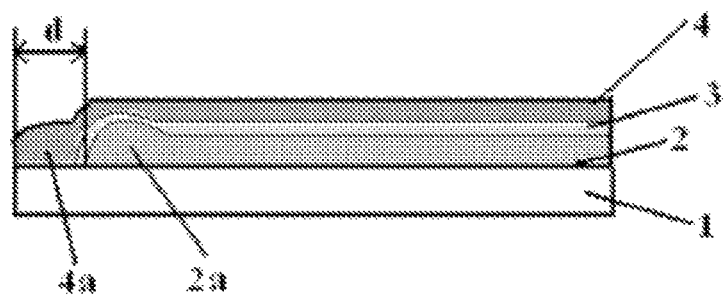

As shown in FIGS. 2A to 2C, an example of a method for manufacturing a flexible substrate according to an embodiment of the present disclosure may comprise steps of: S1: coating a glass carrier 1 with a first film layer 2; S2: coating a glass carrier 1 with a second film layer 4 so that the second film layer 4 covers the first film layer 2, wherein the second film layer 4 has an area greater than an area of the first film layer 2. Then, the plurality of formed film layers are peeled off from the glass carrier 1 to form a flexible substrate.

In the method for manufacturing the flexible substrate according to the embodiments of the present disclosure, although a portion 2a having an unstable thickness is formed at an edge of the first film layer during the first coating, the glass carrier is coated with the second film layer over the first film layer so that the second film layer covers the first film layer. In other words, an area of the second film layer is greater than an area of the first film layer, so that the portion 2a having the unstable thickness may be covered by the subsequently coated second film layer. As a result, a portion 4a having an unstable thickness is only formed at an edge of the second film layer, and a planarization may thus be realized. In this way, the applicable process area is increased, and it eliminates the problems caused by double-layer coating.

In an optional embodiment, a blocking layer 3 (for example, formed of an inorganic material capable of blocking water and/or oxygen) is provided on the first film layer 2 for blocking water and/or oxygen before the step S2, and the second film layer 4 covers the blocking layer 3 in the step S2.

It should be noted that the present disclosure is not limited to coating two film layers, and a plurality of film layers may be coated as long as at least one pair of adjacent film layers of the plurality of film layers are formed by the same manner as the first film layer and the second film layer. Optionally, a blocking layer (for example, formed of an inorganic material capable of blocking water and/or oxygen) may be provided between the at least one pair of adjacent film layers for blocking water and/or oxygen. In the above case, the at least one pair of adjacent film layers comprises one pair of adjacent film layers, and the first film layer is coated on the glass carrier.

In an embodiment, the first film layer 2 and the second film layer 4 are polyimide film layers. However, the present disclosure is not limited thereto, and any materials suitable for forming the flexible substrate may be used.

In addition, in an embodiment, the glass carrier may be coated with the first film layer 2 and the second film layer 4 by means of a slit extrusion coating. In this way, it is possible to realize film layers having a large area and a high thickness, and to save materials. Moreover, the method for manufacturing the flexible substrate according to the present disclosure is particularly suitable for the slit extrusion coating, since the problem of the region having an unstable thickness mainly occurs in such a coating manner. In addition, the blocking layer 3 may be formed using any suitable means and materials that are available.

In an optional embodiment, in step S2, an edge of the first film layer 2 is spaced apart from an edge of the second film layer 4 by a distance of 5 mm or more, i.e., a distance d between the edge of the first film layer 2 and the edge of the second film layer 4 is greater than or equal to 5 mm. It should be noted that the above-described second film layer can be easily realized so that the edge of the first film layer is spaced apart from the edge of the second film layer by a certain distance, for example equal to or greater than 5 mm using a conventional equipment by adjusting process parameters, for example, by modifying the process parameters inputted into a processing software, without the need for additional equipments and processes.

In an optional embodiment, a thickness of the second film layer 4 is greater than or equal to 10% of a thickness of the first film layer 2. The reason for this arrangement is that the inventor has found that the height of the raised portion of the region of the film layers having the unstable thickness is generally 10% of the thickness of the film layers. Therefore, the arrangement that the thickness of the second film layer is greater than or equal to 10% of the thickness of the first film layer can ensure that the second film layer necessarily covers the region of the first film layer having the unstable thickness, thereby achieving the planarization of this region.

The method for manufacturing the flexible substrate according to the present disclosure has been described above with reference to specific embodiments. The present disclosure also provides a flexible substrate manufactured by the above-described method and a display device comprising the flexible substrate.

Thus, the disclosure has been described with reference to the optional embodiments. It should be understood by those skilled in the art that various modifications, substitutions and additions may be made to the present disclosure without departing from the spirit and scope of the disclosure. Therefore, the scope of the present disclosure is not limited to the specific embodiments described above, but should be defined by the appended claims.

What is claimed is:

1. A method for manufacturing a flexible substrate, comprising steps of:
   coating a glass carrier with a plurality of film layers, wherein each of at least one pair of adjacent film layers of the plurality of film layers is formed through steps of:
      S1: coating the glass carrier with a first film layer; and
      S2: coating the glass carrier with a second film layer over the first film layer so that the second film layer covers the first film layer, wherein the second film layer has an area greater than an area of the first film layer; and
   peeling off the plurality of film layers from the glass carrier to form the flexible substrate,
   wherein a portion having an unstable thickness is formed at an edge of the first film layer during the step S1, the first film layer being made from polyimide, and the portion having the unstable thickness is covered by the second film layer so that the portion having the unstable thickness is only formed at an edge of the second film layer, wherein the portion having the unstable thickness is a raised portion, a height of which is 10% of a thickness of the film layers, and wherein the glass carrier is coated with the first film layer and the second film layer by means of a slit extrusion coating.

2. The method according to claim 1, wherein in step S2, an edge of the first film layer is spaced apart from an edge of the second film layer by a distance of 5 mm or more.

3. The method according to claim 1, wherein the at least one pair of adjacent film layers comprises one pair of adjacent film layers, and the first film layer is coated on the glass carrier.

4. The method according to claim 1, wherein the second film layer is a polyimide film layer.

5. A flexible substrate manufactured by the method according to claim 1.

6. The flexible substrate according to claim 5, wherein a thickness of the second film layer is greater than or equal to 10% of a thickness of the first film layer.

7. A display device, comprising the flexible substrate according to claim 5.

8. A display device, comprising the flexible substrate according to claim 6.

9. The method according to claim 2, wherein the at least one pair of adjacent film layers comprises one pair of adjacent film layers, and the first film layer is coated on the glass carrier.

10. The method according to claim 2, wherein the second film layer is a polyimide film layer.

11. A flexible substrate manufactured by the method according to claim 2.

12. A flexible substrate manufactured by the method according to claim 3.

13. The method according to claim 3, wherein the second film layer is a polymide film layer.

14. A flexible substrate manufactured by the method according to claim 4.

15. A flexible substrate manufactured by the method according to claim 13.

* * * * *